United States Patent
Wang et al.

(10) Patent No.: US 10,504,940 B2
(45) Date of Patent: Dec. 10, 2019

(54) THIN FILM TRANSISTOR, METHOD FOR MANUFACTURING THE SAME, ARRAY SUBSTRATE AND DISPLAY DEVICE

(71) Applicants: BOE Technology Group Co., Ltd., Beijing (CN); Chongqing BOE Optoelectronics Technology Co., Ltd., Chongqing (CN)

(72) Inventors: Xiaoyuan Wang, Beijing (CN); Ni Yang, Beijing (CN); Yan Fang, Beijing (CN); Zhijian Qi, Beijing (CN); Shaoru Li, Beijing (CN)

(73) Assignees: BOE Technology Group Co., Ltd., Beijing (CN); Chongqing BOE Optoelectronics Technology Co., Ltd., Chongqing (CN)

( * ) Notice: Subject to any disclaimer, the term of this patent is extended or adjusted under 35 U.S.C. 154(b) by 3 days.

(21) Appl. No.: 15/820,121

(22) Filed: Nov. 21, 2017

(65) Prior Publication Data
US 2018/0308873 A1 Oct. 25, 2018

(30) Foreign Application Priority Data

Apr. 25, 2017 (CN) .......................... 2017 1 0280348

(51) Int. Cl.
*H01L 29/41* (2006.01)
*H01L 27/12* (2006.01)
*H01L 29/417* (2006.01)

(52) U.S. Cl.
CPC .... *H01L 27/1255* (2013.01); *H01L 29/41733* (2013.01); *H01L 27/1259* (2013.01)

(58) Field of Classification Search
CPC . H01L 29/0882; H01L 29/0886; H01L 29/41; H01L 29/41725
See application file for complete search history.

(56) References Cited

U.S. PATENT DOCUMENTS

2014/0306191 A1* 10/2014 Lee ..................... H01L 27/3225
257/40

* cited by examiner

*Primary Examiner* — Jae Lee
(74) *Attorney, Agent, or Firm* — McDermott Will & Emery LLP

(57) ABSTRACT

A thin film transistor comprises a gate, a gate insulating layer, an active layer, a source electrode and a drain electrode. The drain electrode comprises a first sub-drain electrode and at least one second sub-drain electrode. A first portion of the active layer between the first sub-drain electrode and the source electrode and a second portion of the active layer between each of the at least one second sub-drain electrode and the source electrode are used for forming different portions of a primary channel, respectively. The first sub-drain electrode is a signal input electrode, and a third portion of the active layer between the first sub-drain electrode and each of the at least one second sub-drain electrode is used for forming an auxiliary channel. A channel length of the auxiliary channel is less than or equal to a channel length of the primary channel.

15 Claims, 6 Drawing Sheets

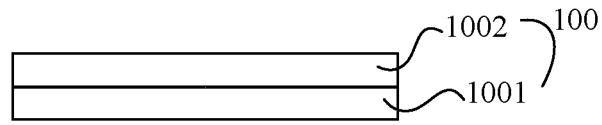

Fig. 10

| A first conducting layer including the gate, the gate insulating layer, the active layer, and a second conducting layer including the source electrode and the drain electrode are formed on a substrate. The active layer is used for forming a primary channel between the source electrode and the drain electrode. The drain electrode includes the first sub-drain electrode and at least one second sub-drain electrode. The first portion of the active layer between the first sub-drain electrode and the source electrode and the second portion of the active layer between each of the at least one second sub-drain electrode and the source electrode are used for forming different portions of the primary channel, respectively. The first sub-drain electrode is a signal input electrode, and the third portion of the active layer between the first sub-drain electrode and each of the at least one second sub-drain electrode is used for forming an auxiliary channel. The channel length of the auxiliary channel is less than or equal to the channel length of the primary channel. | ─S101 |
|---|---|

Fig. 11

THIN FILM TRANSISTOR, METHOD FOR MANUFACTURING THE SAME, ARRAY SUBSTRATE AND DISPLAY DEVICE

CROSS-REFERENCE TO RELATED APPLICATION

This application claims priority to Chinese Patent Application No. 201710280348.4, filed on Apr. 25, 2017, titled "THIN FILM TRANSISTOR, METHOD FOR MANUFACTURING THE SAME, ARRAY SUBSTRATE AND DISPLAY DEVICE", which is incorporated herein by reference in its entirety.

TECHNICAL FIELD

The present disclosure relates to a technical field of display, and more particularly to a thin film transistor, a method for manufacturing the same, an array substrate and a display device.

BACKGROUND

In a Liquid Crystal Display (LCD) or an Organic Light Emitting Diode (OLED) display, each of a plurality of sub-pixel units is driven by a corresponding Thin Film Transistor (TFT), so that pictures may be displayed by the display at high speed, high brightness and high contrast.

The TFT functions as a switch for connecting a data line and a corresponding sub-pixel unit of the plurality of sub-pixel units. The TFT includes a gate, a source electrode and a drain electrode which is connected to the data line. Under the control of the gate, the data line charges or discharges a storage capacitor corresponding to the sub-pixel unit. If the TFT is in an on state, the drain electrode and the source electrode are connected, and an on-state current passes through a channel formed by a portion of an active layer between the source electrode and the drain electrode to charge the storage capacitor corresponding to the sub-pixel unit. If the TFT is in an off state, the drain electrode and the source electrode are disconnected, and the charging of the storage capacitor is stopped.

SUMMARY

According to one aspect, an embodiment of the present disclosure provides a thin film transistor. The thin film transistor includes a gate, a gate insulating layer, an active layer, a source electrode and a drain electrode. The drain electrode includes a first sub-drain electrode and at least one second sub-drain electrode. A first portion of the active layer between the first sub-drain electrode and the source electrode and a second portion of the active layer between each of the at least one second sub-drain electrode and the source electrode are used for forming different portions of a primary channel, respectively. The first sub-drain electrode is a signal input electrode, and a third portion of the active layer between the first sub-drain electrode and each of the at least one second sub-drain electrode is used for forming an auxiliary channel. A channel length of the auxiliary channel is less than or equal to a channel length of the primary channel.

Optionally, the at least one second sub-drain electrode includes a plurality of second sub-drain electrodes.

Optionally, the channel length of the auxiliary channel is about 2 μm to 5 μm.

Further optionally, a width of a side of each of the at least one second sub-drain electrode close to the primary channel is greater than or equal to a width of another side of that away from the primary channel.

Optionally, an included angle between the auxiliary channel and the primary channel is about 30° to 60° or is about 90°.

Further optionally, the primary channel is of a U-shaped structure including a bent portion and two extended portions connected to two ends of the bent portion respectively. The drain electrode comprises two strip-shaped arms corresponding to the two extended portions and a connecting arm corresponding to the bent portion. Two ends of the connecting arm connect the two strip-shaped arms, respectively. The auxiliary channel is formed in a portion of the drain electrode beyond the connecting arm.

Optionally, the auxiliary channel is formed at a junction of each of the two strip-shaped arms with the connecting arm.

According to another aspect, an embodiment of the present disclosure provides an array substrate. The array substrate comprises a substrate and a plurality of thin film transistors described above arranged on the substrate.

According to still another aspect, an embodiment of the present disclosure provides a display device. The display device includes the array substrate described above.

According to yet another aspect, an embodiment of the present disclosure provides a method for manufacturing the thin film transistor described above. The method comprises: forming, on a substrate, a first conducting layer including the gate, the gate insulating layer, the active layer, and a second conducting layer including the source electrode and the drain electrode. The drain electrode includes a first sub-drain electrode and at least one second sub-drain electrode. The first portion of the active layer between the first sub-drain electrode and the source electrode and the second portion of the active layer between each of the at least one second sub-drain electrode and the source electrode are used for forming different portions of the primary channel, respectively. The first sub-drain electrode is a signal input electrode, and the third portion of the active layer between the first sub-drain electrode and each of the second sub-drain electrodes is used for forming the auxiliary channel. The channel length of the auxiliary channel is less than or equal to the channel length of the primary channel.

BRIEF DESCRIPTION OF THE DRAWINGS

To describe the technical solutions in the embodiments of the present disclosure more clearly, the accompanying drawings to be used in the descriptions of the embodiments will be briefly described below. Apparently, the accompanying drawings described hereinafter are only some of embodiments of the present disclosure, and a person of ordinary skill in the art can obtain other accompanying drawings according to these drawings without paying any creative effort.

FIG. 10 is a schematic structure diagram of a display device according to an embodiment of the present disclosure; and FIG. 11 is a flowchart of a method for manufacturing a thin film transistor according to an embodiment of the present disclosure.

DETAILED DESCRIPTION

The technical solutions in the embodiments of the present disclosure will be clearly and completely described below with reference to the accompanying drawings in the embodiments of the present disclosure. Apparently, the embodiments described herein are merely a part but not all of the embodiments of the present disclosure. All other embodiments obtained by a person of ordinary skill in the art without paying any creative effort on the basis of the embodiments in the present disclosure shall fall into the protection scope of the present disclosure.

Figure 1:
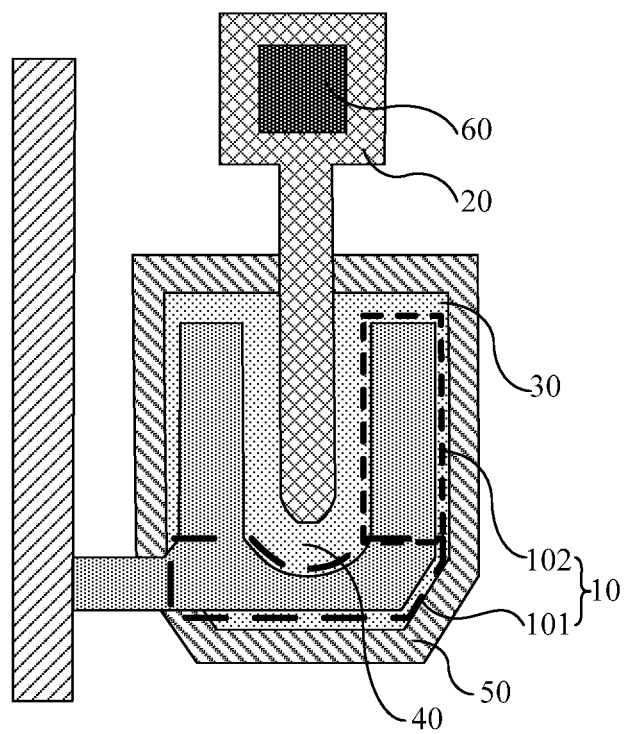
FIG. 1 is a schematic structure diagram of a thin film transistor of a U-shaped structure.

In order to ensure a high resolution of the display and smooth changes of displayed images, charging time of the thin film transistor is short when it is in the on state. However, short charging time may lead to insufficient charging of the storage capacitor corresponding to a sub-pixel unit. In order to improve a charging rate of the storage capacitor, generally, a width-to-length ratio W/L of a channel of the thin film transistor may be increased. By taking a thin film transistor of a U-shaped structure as example, as shown in FIG. 1, a drain electrode 10 of the thin film transistor of the U-shaped structure includes two strip-shaped arms 102 and a connecting arm 101 connecting ends of the two strip-shaped arms 102. A portion of an active layer 30 between a source electrode 20 and a drain electrode 10 forms a channel 40 which is also of a U-shaped structure. By increasing the length of the free ends of the two strip-shaped arms 102, the width-to-length ratio W/L of the channel may be increased by increasing the W. However, the increase in the length of the free ends of the two strip-shaped arms 102 may reduce an aperture ratio of the sub-pixel unit. As a result, a transmittance of the sub-pixel unit may be influenced and power consumption of backlight may be increased. Moreover, a portion of the drain electrode 10 and a corresponding portion of the gate 50 of the thin film transistor whose projections are overlapped may generate stray capacitance when the thin film transistor is in the off state. The larger the portions are, the higher stray capacitance they generate. For a plurality of signal lines activated by line-by-line scanning, during the transmission of a signal to an on-state thin film transistor connected to a signal line of the plurality of signal lines, stray capacitances generated by other off-state thin film transistors on the signal line may increase the load at time when this on-state thin film transistor charges a storage capacitor 60 corresponding to the source electrode 20, so that the charging rate of the storage capacitor 60 may be reduced. On the other hand, the width-to-length ratio W/L of the channel may also be increased by decreasing a channel length L of the channel 40. However, due to limitations of technical conditions, the reducible range of the channel length L is limited, and the channel length L may not be less than a minimum value of a machining precision; or otherwise, this purpose may not be achieved.

Figure 2:
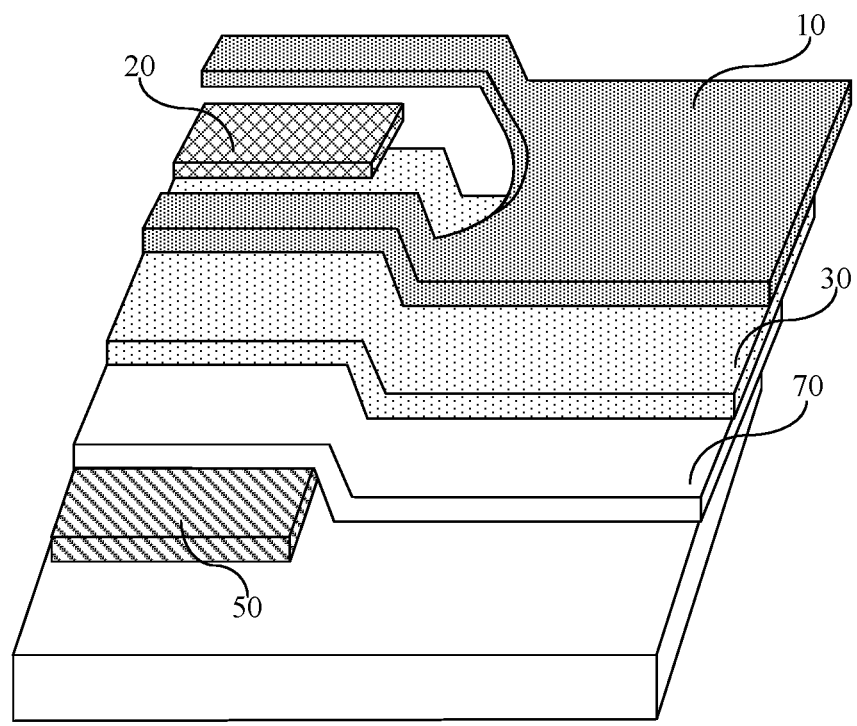
FIG. 2 is a hierarchical structure diagram of a thin film transistor according to an embodiment of the present disclosure.
Figure 3:
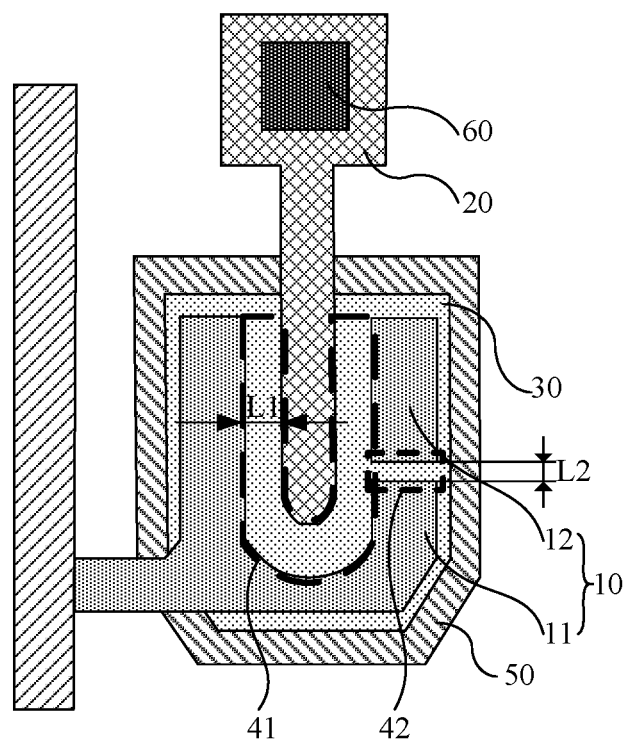
FIG. 3 is a schematic structure diagram of a thin film transistor including one second sub-drain electrode according to an embodiment of the present disclosure.
Figure 4:
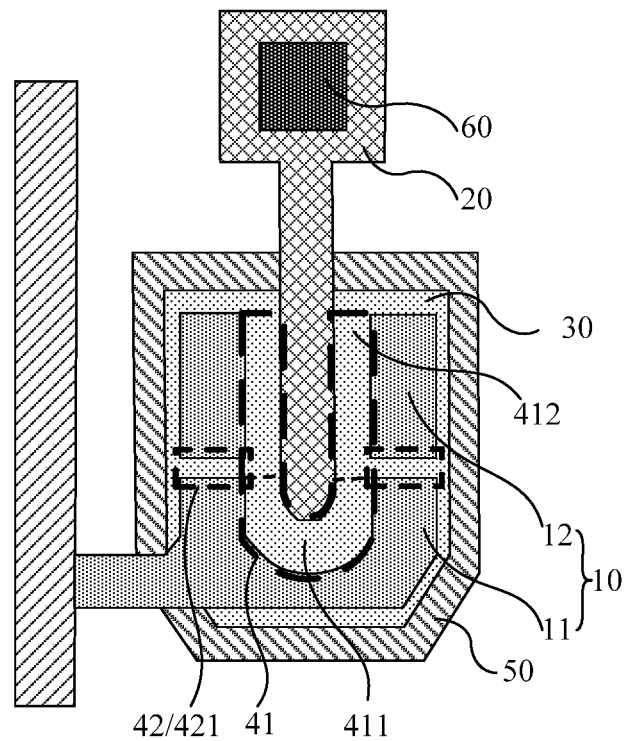
FIG. 4 is a schematic structure diagram of a thin film transistor including a plurality of second sun-drain electrodes according to an embodiment of the present disclosure.

In order to solve the problem that the display quality of the display is influenced by the insufficient charging of the storage capacitor due to low charging rate of the storage capacitor in the thin film transistor, an embodiment of the present disclosure provides a thin film transistor. As shown in FIG. 2, the thin film transistor includes a gate 50, a gate insulating layer 70, an active layer 30, a source electrode 20 and a drain electrode 10. As shown in FIGS. 3 and 4, a primary portion of the active layer 30 between the source electrode 20 and the drain electrode 10 is used for forming a primary channel 41. As shown in FIG. 3, the drain electrode 10 includes a first sub-drain electrode 11 and at least one second sub-drain electrode 12. A first portion 411 of the active layer 30 between the first sub-drain electrode 11 and the source electrode 20 and a second portion 412 of the active layer 30 between each of the at least one second sub-drain electrode 12 and the source electrode 20 are used for forming different portions of the primary channel 41, respectively. The first sub-drain electrode 11 is a signal input electrode. A third portion 421 of the active layer 30 between the first sub-drain electrode 11 and each of the at least one second sub-drain electrode 12 is used for forming an auxiliary channel 42. A channel length L2 of the auxiliary channel 42 is less than or equal to a channel length L1 of the primary channel 41.

It is to be noted that, the thin film transistor described in this embodiment of the present disclosure is not limited to a thin film transistor of a U-shaped structure shown in FIGS. 2 and 3, and I-shaped, T-shaped, L-shaped or other common thin film transistors are also applicable.

In an embodiment of the present disclosure, positions of the source electrode 20 and the drain electrode 10 may be interchangeable.

Wherein, the first portion of the active layer 30 between the first sub-drain electrode 11 and the source electrode 20 and the second portion of the active layer 30 between each of the at least one second sub-drain electrode 12 and the source electrode 20 being used for forming different portions of the primary channel 41 respectively means that, one portion of the primary channel 41 formed by the first portion of the active layer 30 between the first sub-drain electrode 11 and the source electrode 20 and the other portion of the primary channel 41 formed by the second portion of the active layer 30 between each of the at least one second sub-drain electrode 12 and the source electrode 20 together form the primary channel 41. The portion of the primary channel 41 formed by the first portion of the active layer 30 between the first sub-drain electrode 11 and the source electrode 20 and the other portion of the primary channel 41 formed by the second portion of the active layer 30 between each of the at least one second sub-drain electrode 12 and the source electrode 20 are not overlapped with each other and are different portions.

In addition, the first sub-drain electrode 11 being a signal input electrode means that, the first sub-drain electrode 11 is a portion in the drain electrode 10 connected to a signal line. Within a display region, the signal line may be a grating signal line for connecting a plurality of sub-pixel unit and controlling the display of the plurality of sub-pixel unit. Within a wiring region around the display region, the signal line may be a signal line lead.

As shown in FIG. 3, the at least one second sub-drain electrode 12 comprise one second sub-drain electrode. The third portion of the active layer 30 between the first sub-drain electrode 11 and the second sub-drain electrode 12 is used for forming the auxiliary channel 42, that is, the auxiliary channel 42 separates the first sub-drain electrode 11 from the second sub-drain electrode 12.

In this situation, when the gate 50 drives the thin film transistor to be in the on state, the on-state current on the first sub-drain electrode 11 may enter the source electrode 20 through the portion of the primary channel 41 formed by the first portion of the active layer 30 between the first sub-drain electrode 11 and the source electrode 20. Meanwhile, the on-state current on the first sub-drain electrode 11 may also enter the second sub-drain electrode 12 through the auxiliary channel 42 formed by the third portion of the active layer 30 between the first sub-drain electrode 11 and the second sub-drain electrode 12 and then enter the source electrode 20 through the portion of the primary channel 41 formed by the second portion of the active layer 30 between the second sub-drain electrode 12 and the source electrode 20. In other words, both the first sub-drain electrode 11 and the second sub-drain electrode 12 may work when the thin film transistor is in the on state. In addition, the channel length L2 of the auxiliary channel 42 is less than or equal to the channel length L1 of the primary channel 41. Thus, if the channel length L2 of the auxiliary channel 42 is less and when the gate 50 drives the thin film transistor to be in the on state, the on-state current on the first sub-drain electrode 11 very rapidly enters the second sub-drain electrode 12 through the auxiliary channel 42 formed by the third portion of the active layer 30 between the first sub-drain electrode 11 and the second sub-drain electrode 12. It may be considered that the arrangement of the auxiliary channel 42 will not reduce the transmission rate of the on-state current.

However, when the gate 50 drives the thin film transistor to be in the off state, only the first sub-drain electrode 11 in the drain electrode 10 is connected to a signal line, that is, only a portion of the first sub-drain electrode 11 and a corresponding portion of the gate 50 whose projections are overlapped will generate stray capacitance when the thin film transistor is in the off state. For the second sub-drain electrode 12 not connected to the signal line, stray capacitance will not be generated even if it has a portion whose projection is overlapped with a corresponding portion of the gate 50 when the thin film transistor is in the off state. In this way, without influencing the charging rate of the on-state current to the storage capacitor, the stray capacitance may be decreased, the load of the signal line may be reduced, and thus the charging rate of the pixel capacitor may be improved. In addition, it may be unnecessary to increase the size of the drain electrode 10 to influence the aperture ratio of the sub-pixel unit. Moreover, by decreasing the stray capacitance, the signal crosstalk may be relieved.

It is to be noted that, when the gate 50 drives the thin film transistor to be in the on state, different portions of the active layer 30 used for forming the primary channel 41 exist as a real primary channel 41, and the on-state current from the first sub-drain electrode 11 and/or the second sub-drain electrode 12 may enter the source electrode 20 through the actual primary channel 41. When the thin film transistor is in the off state, although a portion of the active layer 30 between the first sub-drain electrode 11 and the source electrode 20 and the other portion of the active layer 30 between the second sub-drain electrode 12 and the source electrode 20 are also called a primary channel 41, these portions may not function as the primary channel 41. Similarly, for the auxiliary channel 42, only when the gate 50 drives the thin film transistor to be in the on state, there is a real auxiliary channel 42 and the function of the auxiliary channel 42 may be realized.

The thin film transistor provided by this embodiment of the present disclosure includes the gate, the gate insulating layer, the active layer, the source electrode and the drain electrode. The primary portion of the active layer between the source electrode and the drain electrode is used for forming a primary channel. The drain electrode includes the first sub-drain electrode and at least one second sub-drain electrode, and the first portion of the active layer between the first sub-drain electrode and the source electrode and the second portion of the active layer between each of the at least one second sub-drain electrode and the source electrode are used for forming different portions of the primary channel, respectively. The first sub-drain electrode is a signal input electrode, and the third portion of the active layer between the first sub-drain electrode and each of the at least one second sub-drain electrode is used for forming an auxiliary channel, wherein the channel length of the auxiliary channel is less than or equal to the channel length of the primary channel. By dividing the drain electrode into a first sub-drain electrode and at least one second sub-drain electrode, the first portion of the active layer between the first sub-drain electrode and the source electrode and the second portion of the active layer between each of the at least one second sub-drain electrode and the source electrode are used for forming different portions of a primary channel respectively, so as to form the primary channel. In addition, the third portion of the active layer between the first sub-drain electrode and each of the at least one second sub-drain electrode is used for forming an auxiliary channel. The channel length of the auxiliary channel is less than or equal to the channel length of the primary channel, and thus the charging rate of the storage capacitor when the thin film transistor is in the on state may not be influenced. In addition, the first sub-drain electrode is a signal input electrode so that the at least one second sub-drain electrode may not be communicated with a signal line when the thin film transistor is in the off state. As a result, by reducing a portion of the drain electrode and the corresponding portion of the gate of the thin film transistor whose projections are overlapped, the stray capacitance may be decreased. Accordingly, the charging load of a storage capacitor may be reduced, and thus the charging rate of the storage capacitor may be improved.

In an embodiment of the present disclosure, as shown in FIG. 4, the at least one second sub-drain electrode 12 includes a plurality of second sub-drain electrodes 12.

For example, as shown in FIG. 4, for a thin film transistor of a U-shaped structure, the primary channel 41 thereof is also of a U-shaped structure. The drain electrode 10 is divided into one first sub-drain electrode 11 and two second sub-drain electrodes 12, wherein an auxiliary channel 42 is formed between the first sub-drain electrode 11 and each of the two second sub-drain electrodes 12. In this way, the stray capacitance generated when the thin film transistor is in the off state may be further reduced.

Figure 5:
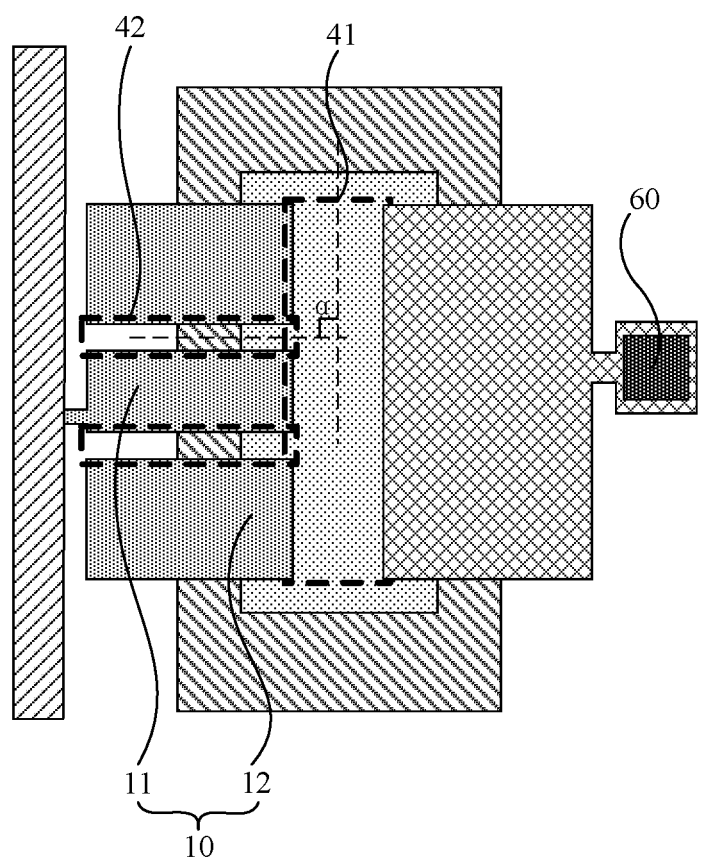
FIG. 5 is a schematic structure diagram of a thin film transistor of an I-shaped structure according to an embodiment of the present disclosure.

For another example, as shown in FIG. 5, when the thin film transistor is a thin film transistor of an I-shaped structure, the drain electrode 10 includes a first sub-drain electrode 11 connected to a signal line to serve as an input electrode and two second sub-drain electrodes 12 located on two sides of the first sub-drain electrode 11. An auxiliary channel 42 is formed between each of the two second sub-drain electrodes 12 and the first sub-drain electrode 11.

In an embodiment of the present disclosure, the channel length L2 of the auxiliary channel 42 substantially ranges from 2 μm to 5 μm.

It is to be noted that, both the auxiliary channel 42 formed by the third portion of the active layer 30 between the first sub-drain electrode 11 and each of the at least one second sub-drain electrode 12 and the primary channel 41 are manufactured by processes such as film-forming, masking, exposure and etching. The primary channel 41 and the auxiliary channel 42 may be exposed by an exposure machine using Half Tone Mask (HTM), Single Slit Mask (SSM), or Modified Single Slit Mask (MSM). By using the MSM, the channel length of a bottom portion of the U-shaped channel may be increased, compared to that by using the SSM, and then the risk of short circuit on the bottom portion of the channel may be reduced. The exposure machine has a minimum resolution capability, and by the above multiple exposure and etching methods, the minimum resolution may be difficult to be less than 2 μm. Therefore, it is difficult to manufacture an auxiliary channel 42 having a channel length L2 less than 2 μm. In addition, if the channel length L2 of the auxiliary channel 42 is greater than 5 μm, it is likely to result in adverse effects on the transmission rate of the on-state current due to too large channel length L2 of the auxiliary channel 42.

Figure 6:
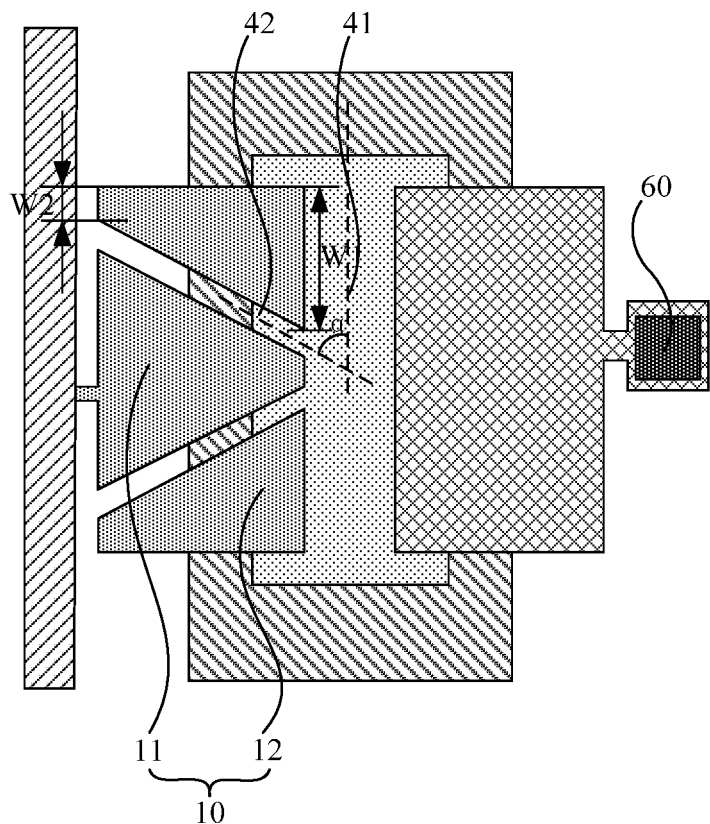
FIG. 6 is a schematic structure diagram of the thin film transistor of an I-shaped structure according to another embodiment of the present disclosure.

In an embodiment of the present disclosure, as shown in FIG. 6, a width W1 of a side of each of the at least one second sub-drain electrode 12 close to the primary channel 41 is greater than or equal to a width W2 of another side of that away from the primary channel 41.

In this way, as shown in FIG. 6, when the thin film transistor is in the on state, one portion of the on-state current input by the first sub-drain electrode 11 directly enters the source electrode 20 through the portion of the primary channel 41 formed by the first portion of the active layer 30 between the first sub-drain electrode 11 and the source electrode 20; meanwhile, the other portion of the on-state current enters each of the two second sub-drain electrodes 12 through a corresponding auxiliary channel 42 and then enters the source electrode 20 through the portion of the primary channel 41 between each of the two second sub-drain electrodes 12 and the source electrode 20. Therefore, the transmission area where the on-state current enters each of the two second sub-drain electrodes 12 through the corresponding auxiliary channel 42 may be increased, the transmission route may be shortened, and charging speed of the storage capacitor 60 when the thin film transistor is in the on state may thus be increased.

In an embodiment of the present disclosure, as shown in FIG. 6, an included angle α between the auxiliary channel 42 and the primary channel 41 is about 30° to 60°, such as 30°, 35°, 40°, 45°, 50°, 55°, 60°, etc. In another embodiment of the present disclosure, as shown in FIG. 5, the included angle α between the auxiliary channel 42 and the primary channel 41 is about 90°.

When the width W1 of a side of each of the two second sub-drain electrodes 12 close to the primary channel 41 is greater than or equal to the width W2 of another side of that away from the primary channel 41, in an example, the included angle α between the auxiliary channel 42 and the primary channel 41 is about 30° to 60°. If the included angle α is less than 30°, it is likely that the width of the portion of the primary channel 41 formed by the first portion of the active layer 30 between the first sub-drain electrode 11 and the source electrode 20 is too narrow due to too small included angle α, so that the speed of directly writing a signal into the source electrode 20 through the portion of the primary channel 41 may be decreased. If the included angle α is greater than 60° and less than 90°, due to too large included angle α, it is likely that the effects of increasing the transmission area and shortening the transmission route are not obvious.

In an example, as shown in FIG. 5, the auxiliary channel 42 is perpendicular to the primary channel 41, that is, the included angle α is about 90°. In this way, under the premise of ensuring the charging rate of the on-state current on the first sub-drain electrode 11 to the storage capacitor 60 when the thin film transistor is in the on state, the machining difficulty may be reduced, the machining precision may be improved, and the channel length L2 of the auxiliary channel 42 may be reduced as far as possible.

Figure 7:
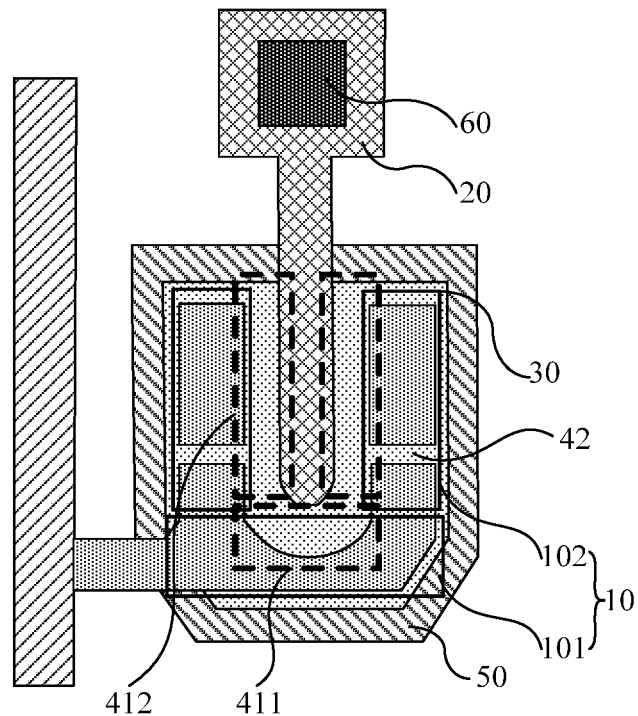
FIG. 7 is a schematic structure diagram of a thin film transistor of a U-shaped structure according to an embodiment of the present disclosure.

In an embodiment of the present disclosure, as shown in FIG. 7, the primary channel 41 is of a U-shaped structure, and the U-shaped structure includes a bent portion 411 and two extended portions 412 connected to two ends of the bent portion 411 respectively. The drain electrode 10 includes two strip-shaped arms 102 corresponding to the two extended portions 412 and a connecting arm 101 corresponding to the bent portion 411, and two ends of the connecting arm 101 connect the two strip-shaped arms 102, respectively. In this way, the auxiliary channel 42 is formed in a portion of the drain electrode 10 beyond the connecting arm 42.

It is to be noted that, those skilled in the art should understand that the primary channel 41 of the U-shaped structure in this embodiment of the present disclosure is not limited to a U-shape having an arc-shaped bent portion 411 and two extended portions 412 connected to the arc-shaped bent portion 411 as long as ends of two parallel extended portions 412 may be connected by the bent portion 411. The shape of the bent portion 411 is not specifically limited. For example, two ends of the bent portion 411 connect two extended portions 412, respectively, and a middle portion of the bent portion 411 may be bent in different directions. For another example, the bent portion 411 may also be a straight strip, two ends of which are connected to the two extended portions 412 and have an included angle. This included angle may also be 90°. That is, two ends of the bent portion 411 are perpendicularly connected to the two extended portions 412, respectively. Similarly, the drain electrode 10 corresponding to the primary channel 41 of the U-shaped structure is also of a U-shaped structure including two parallel strip-shaped arms 102, and ends of the two parallel strip-shaped arms 102 are connected by a connecting arm 101. The shape of the connecting arm 101 is not specifically limited in this embodiment of the present disclosure as long as two ends of the connecting arm 101 connect the ends of the two parallel strip-shaped arms 102 to form a U-shape or an approximate U-shape, which is considered as the U-shaped structure in this embodiment of the present disclosure.

For a display device having a large size and a high resolution, particularly for a GOA (Gate Driver on Array) product, a primary channel 41 of a U-shaped structure is generally used. As shown in FIG. 7, the auxiliary channel 42 is formed in a portion of the drain electrode 10 beyond the connecting arm 101, and thus it may be ensured that a signal on the drain electrode 10 may directly enter the source electrode 20 through the portion of the primary channel 41 between the connecting arm 101 and the source electrode 20 when the thin film transistor is in the on state. On this basis, the auxiliary channel 42 may separate at least one portion of the strip-shaped arms 102 on two sides. As a result, the stray capacitance may be decreased, the load may be reduced, and the charging rate of the storage capacitor 60 may be improved.

Figure 8:
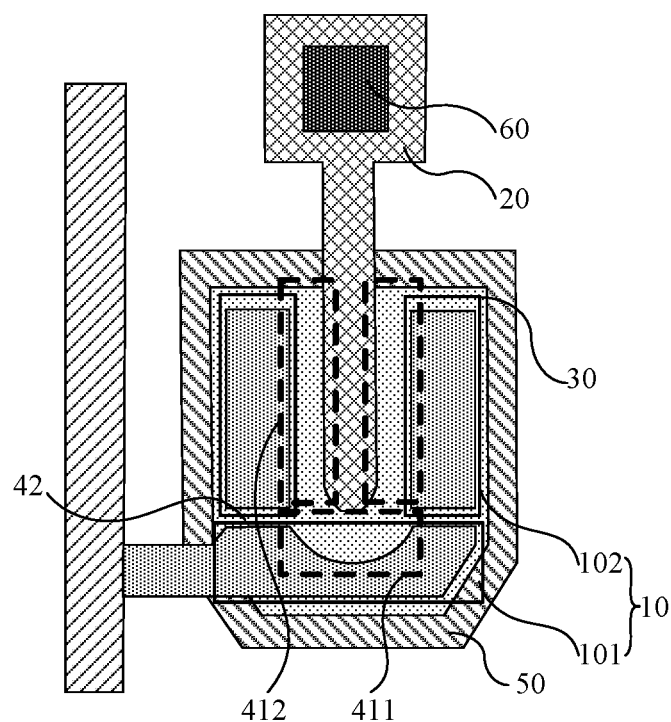
FIG. 8 is a schematic structure diagram of a thin film transistor of a U-shaped structure according to another embodiment of the present disclosure.

In an embodiment of the present disclosure, as shown in FIG. 8, the auxiliary channel 42 is formed at a junction of each of the two strip-shaped arms 102 with the connecting arm 101.

In this way, the two strip-shaped arms 102 may be separated from the connecting arm 101 connected to the signal line by the auxiliary channel 42, so that the stray capacitance may be decreased to the greatest extent, the load may be reduced and the charging rate of the pixel capacitor 60 may be improved.

Figure 9:
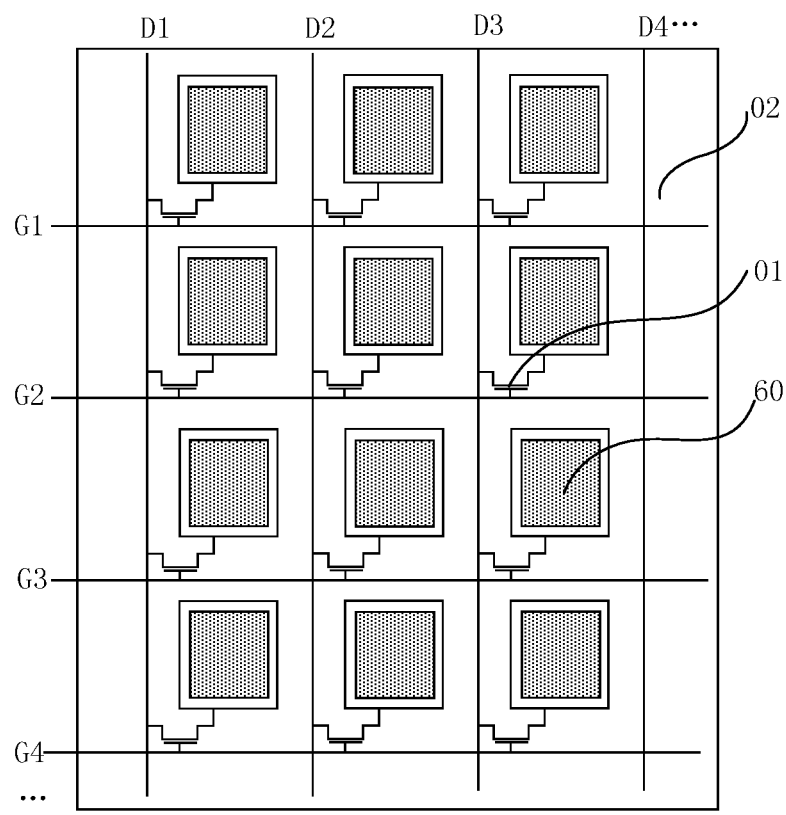
FIG. 9 is a schematic structure diagram of an array substrate according to an embodiment of the present disclosure.

In an embodiment of the present disclosure, an array substrate is provided, as shown in FIG. 9, including a substrate 02 and a plurality of thin film transistors 01 described above arranged on the substrate 02. As shown in FIG. 2-8, each of the plurality of thin film transistors 02 includes a gate 50, a gate insulating layer 70, an active layer 30, a source electrode 20 and a drain electrode 10. As shown in FIGS. 3 and 4, a primary portion of the active layer 30 between the source electrode 20 and the drain electrode 10 is used for forming a primary channel 41. As shown in FIG. 3, the drain electrode 10 includes a first sub-drain electrode 11 and at least one second sub-drain electrode 12. A first portion 411 of the active layer 30 between the first sub-drain electrode 11 and the source electrode 20 and a second portion 412 of the active layer 30 between each of the at least one second sub-drain electrode 12 and the source electrode 20 are used for forming different portions of the primary channel 41, respectively. The first sub-drain electrode 11 is a signal input electrode. A third portion 421 of the active layer 30 between the first sub-drain electrode 11 and each of the at least one second sub-drain electrode 12 is used for forming an auxiliary channel 42. A channel length L2 of the auxiliary channel 42 is less than or equal to a channel length L1 of the primary channel 41.

It is to be noted that, the substrate 02 includes a display region and a peripheral region surrounding the display region. When the plurality of the thin film transistors 01 are arranged within the display region on the substrate 02, the plurality of the thin film transistors 01 are arranged in form of an array, and each of the plurality of the thin film transistors 01 is arranged within a sub-pixel unit in order to control the on/off of signals of the sub-pixel unit. When the plurality of the thin film transistors 01 are arranged within the peripheral region on the substrate 02, signal line leads respectively communicated with signal lines within the display region are arranged within the peripheral region, and the plurality of thin film transistors 01 are connected to the signal line leads within the peripheral region, respectively, to control the on/off of signals.

In the array substrate in the embodiments of the present disclosure, by arranging the thin film transistors 01 of the above-described structure, the stray capacitance of the thin film transistors 01 being in the off state may be decreased, and the load of the signal line when each of the plurality of the thin film transistors 01 charges a corresponding storage capacitor in the on state may be reduced. In addition, the data delay may be decreased, and the charging rate of the storage capacitor 60 may be improved.

The array substrate including the plurality of the thin film transistors 01 has been described above in detail in the above descriptions of the thin film transistor 01 and will not be repeated here.

As shown in FIG. 10, according to an embodiment of the present disclosure, a display device 100 is provided, including a backlight module 1001 and an array substrate 1002 described above. The array substrate 1002 includes a substrate 02 and a plurality of thin film transistors 01 described above arranged on the substrate 02. As shown in FIG. 2-8, each of the plurality of thin film transistors 02 includes a gate 50, a gate insulating layer 70, an active layer 30, a source electrode 20 and a drain electrode 10. As shown in FIGS. 3 and 4, a primary portion of the active layer 30 between the source electrode 20 and the drain electrode 10 is used for forming a primary channel 41. As shown in FIG. 3, the drain electrode 10 includes a first sub-drain electrode 11 and at least one second sub-drain electrode 12. A first portion 411 of the active layer 30 between the first sub-drain electrode 11 and the source electrode 20 and a second portion 412 of the active layer 30 between each of the at least one second sub-drain electrode 12 and the source electrode 20 are used for forming different portions of the primary channel 41, respectively. The first sub-drain electrode 11 is a signal input electrode. A third portion 421 of the active layer 30 between the first sub-drain electrode 11 and each of the at least one second sub-drain electrode 12 is used for forming an auxiliary channel 42. A channel length L2 of the auxiliary channel 42 is less than or equal to a channel length L1 of the primary channel 41.

In the display device 100 in the embodiment of the present disclosure, by arranging an auxiliary channel 42 in each of the plurality of thin film transistors 01, the portion of the second sub-drain electrodes 12 separated by the auxiliary channel 42 may not generate stray capacitance when the corresponding thin film transistor of the plurality of thin film transistors 01 is in the off state, so that the stray capacitance of the thin film transistor 01 in the off state may be decreased. In addition, the load on the signal line when the thin film transistor 10 charges the storage capacitor 60 in the on state may be reduced. Accordingly, the data delay may be decreased, and the charging rate of the storage capacitor 60 is improved, and the display quality of the display device may be thus improved.

The display device including the plurality of the thin film transistors 01 has been described above in detail in the above descriptions of the thin film transistor 01 and will not be repeated here.

In an embodiment of the present disclosure, a method for manufacturing the thin film transistor described in the above embodiments is provided. As shown in FIG. 10, the method includes step 101. In step 101 (S101), a first conducting layer including the gate 50, the gate insulating layer, the active layer 30, and a second conducting layer including the source electrode 20 and the drain electrode 10 forming are formed on a substrate 02. The active layer 30 is used for forming a primary channel 41 between the source electrode 20 and the drain electrode 10. The drain electrode 10 includes the first sub-drain electrode 11 and at least one second sub-drain electrode 12. The first portion of the active layer 30 between the first sub-drain electrode 11 and the source electrode 20 and the second portion of the active layer 30 between each of the at least one second sub-drain electrode 12 and the source electrode 20 are used for forming different portions of the primary channel 41, respectively. The first sub-drain electrode 11 is a signal input electrode, and the third portion of the active layer 30 between the first sub-drain electrode 11 and each of the at least one second sub-drain electrode 12 is used for forming an auxiliary channel 42. The channel length L2 of the auxiliary channel 42 is less than or equal to the channel length L1 of the primary channel 41.

The first conducting layer including the gate 50, the gate insulating layer, the active layer 30 and the second conducting layer including the source electrode 20 and the drain electrode 10 are successively formed on the substrate 02 by film-forming, exposure, developing and etching processes. A semiconductor MIS structures is formed between the first conducting layer and the gate insulating layer 70 and between the first conducting layer and the active layer 30. Generally, the MIS structure may approximately serve as a capacitor. When a strong electric field generated on one side of the first conducting layer or one side of the active layer 30 of the MIS structure reaches a critical value, the first conducting layer and the active layer 30 of the MIS structure may be powered on instantly, and the MIS structure may be recovered to a capacitance state after charges are released. The second conducting layer is formed on the active layer 30, then coated with a photoresist and irradiated by UV light when the second conducting layer is covered by a mask with a pattern. The pattern on the mask is transferred onto the photoresist layer. After the film layer is etched and the photoresist is stripped off, the pattern, the same as the pattern on the mask, is formed on the second conducting layer. In addition to the forming of the source electrode 20 and the drain electrode 10 on the second conducting layer, the mask further includes a pattern of the primary channel 41 and a pattern of the auxiliary channel 42.

In this way, when an electric signal is input into the gate 50 of the first conducting layer to power on the MIS structure, the signal on the gate 50 connects the drain electrode 10 and the source electrode 20 through the primary channel 41 and the auxiliary channel 42 formed by the active layer 30. In this case, the first sub-drain electrode 11 as the signal input electrode imports signals and directly transmits parts of the signals to the source electrode 20. Meanwhile, the other parts of the signals are transmitted to the at least one second sub-drain electrode 12 through the connected auxiliary channel 42 and then transmitted to the source electrode 20 through the at least one second sub-drain electrodes 12 so as to charge the storage capacitor 60. When the gate 50 turns off the signals to recover the MIS structure to a capacitance state, the charging of the pixel capacitor 60 is stopped.

The method for manufacturing the thin film transistor 01 and the working process have been described above in detail in the above descriptions of the thin film transistor 01 and will not be repeated here.

The foregoing descriptions merely show specific implementations of the present disclosure, and the protection scope of the present disclosure is not limited thereto. Any person of skill in the art can readily conceive of variations or replacements within the technical scope disclosed by the embodiments of the present disclosure, and these variations or replacements shall fall into the protection scope of the present disclosure. Accordingly, the protection scope of the present disclosure shall be subject to the protection scope of the claims.

What is claimed is:

1. A thin film transistor, comprising a gate, a gate insulating layer, an active layer, a source electrode and a drain electrode, wherein, the drain electrode comprises a first sub-drain electrode and at least one second sub-drain electrode that are physically detached from one another, and a first portion of the active layer between the first sub-drain electrode and the source electrode, and a second portion of the active layer between each of the at least one second sub-drain electrode and the source electrode are used for forming different portions of a primary channel, respectively;

the first sub-drain electrode is a signal input electrode, and a third portion of the active layer between the first sub-drain electrode and each of the at least one second sub-drain electrode is used for forming an auxiliary channel, a channel length of the auxiliary channel being less than or equal to a channel length of the primary channel.

2. The thin film transistor according to claim 1, wherein, the at least one second sub-drain electrode comprises a plurality of second sub-drain electrodes.

3. The thin film transistor according to claim 1, wherein, the channel length of the auxiliary channel is about 2 μm to 5 μm.

4. The thin film transistor according to claim 1, wherein, a width of a side of each of the at least one second sub-drain electrode close to the primary channel is greater than or equal to a width of another side of that away from the primary channel.

5. The thin film transistor according to claim 4, wherein, an included angle between the auxiliary channel and the primary channel is about 30° to 60°.

6. The thin film transistor according to claim 4, wherein, an included angle between the auxiliary channel and the primary channel is about 90°.

7. The thin film transistor according to claim 1, wherein, the primary channel is of a U-shaped structure comprising a bent portion and two extended portions connected to two ends of the bent portion respectively; the drain electrode comprises two strip-shaped arms corresponding to the two extended portions and a connecting arm corresponding to the bent portion; two ends of the connecting arm are configured to connect to the two strip-shaped arms, respectively; and, the auxiliary channel is formed in a portion of the drain electrode beyond the connecting arm.

8. The thin film transistor according to claim 7, wherein, the auxiliary channel is formed at a junction of each of the two strip-shaped arms with the connecting arm.

9. An array substrate, comprising a substrate and a plurality of thin film transistors arranged on the substrate, wherein, each of the plurality of thin film transistors comprises a gate, a gate insulating layer, an active layer, a source electrode and a drain electrode;

the drain electrode comprises a first sub-drain electrode and at least one second sub-drain electrode are physically detached from one another, and a first portion of the active layer between the first sub-drain electrode and the source electrode, and a second portion of the active layer between each of the at least one second sub-drain electrode and the source electrode are used for forming different portions of a primary channel, respectively; and the first sub-drain electrode is a signal input electrode, and a third portion of the active layer between the first sub-drain electrode and each of the at least one second sub-drain electrode is used for forming an auxiliary channel, a channel length of the auxiliary channel being less than or equal to a channel length of the primary channel.

10. A display device, comprising a backlight module and an array substrate arranged on the backlight module, wherein,
the array substrate comprises a substrate and a plurality of thin film transistors arranged on the substrate;
each of the plurality of thin film transistors comprises a gate, a gate insulating layer, an active layer, a source electrode and a drain electrode;
the drain electrode comprises a first sub-drain electrode and at least one second sub-drain electrode that are physically detached from one another, and a first portion of the active layer between the first sub-drain electrode and the source electrode, and a second portion of the active layer between each of the at least one second sub-drain electrode and the source electrode are used for forming different portions of a primary channel, respectively; and
the first sub-drain electrode is a signal input electrode, and a third portion of the active layer between the first sub-drain electrode and each of the at least one second sub-drain electrode is used for forming an auxiliary channel, a channel length of the auxiliary channel being less than or equal to a channel length of the primary channel.

11. A method for manufacturing the thin film transistor according to claim 1, comprising:
forming, on a substrate, a first conducting layer comprising the gate, the gate insulating layer, the active layer, and a second conducting layer comprising the source electrode and the drain electrode, wherein the drain electrode comprises the first sub-drain electrode and at least one second sub-drain electrode that are physically detached from one another, and the first portion of the active layer between the first sub-drain electrode and the source electrode and the second portion of the active layer between each of the at least one second sub-drain electrode and the source electrode are used for forming different portions of the primary channel, respectively; the first sub-drain electrode is a signal input electrode, and the third portion of the active layer between the first sub-drain electrode and each of the at least one second sub-drain electrode is used for forming the auxiliary channel, the channel length of the auxiliary channel being less than or equal to the channel length of the primary channel.

12. The thin film transistor according to claim 1, wherein the at least one second sub-drain electrode includes one second sub-drain electrode, and the third portion of the active layer between the first sub-drain electrode and the second sub-drain electrode is used for forming the auxiliary channel.

13. The thin film transistor according to claim 2, wherein the plurality of second sub-drain electrodes include two second sub-drain electrodes, the thin film transistor is a thin film transistor of an I-shaped structure, and the two second sub-drain electrodes are located on two opposite sides of the first sub-drain electrode respectively.

14. The thin film transistor according to claim 13, wherein, a width of a side of each of the two second sub-drain electrode close to the primary channel is greater than or equal to a width of another side of that away from the primary channel.

15. The method for manufacturing the thin film transistor according to claim 11, wherein, a half tone mask is used to form the primary channel and the auxiliary channel.

* * * * *